United States Patent
Ye et al.

(10) Patent No.: US 10,495,922 B2
(45) Date of Patent: Dec. 3, 2019

(54) DISPLAY DEVICE

(71) Applicant: Samsung Display Co., Ltd., Yongin-Si, Gyeonggi-Do (KR)

(72) Inventors: Byoungdae Ye, Yongin-si (KR); Hyuk-hwan Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 17 days.

(21) Appl. No.: 15/497,409

(22) Filed: Apr. 26, 2017

(65) Prior Publication Data

US 2017/0315404 A1  Nov. 2, 2017

(30) Foreign Application Priority Data

May 2, 2016 (KR) .................... 10-2016-0054186

(51) Int. Cl.
*F21V 9/00* (2018.01)
*G02F 1/1335* (2006.01)
*H01L 33/50* (2010.01)

(52) U.S. Cl.
CPC .. *G02F 1/133603* (2013.01); *G02F 1/133606* (2013.01); *H01L 33/501* (2013.01); *G02F 2001/133607* (2013.01); *G02F 2001/133614* (2013.01); *H01L 33/508* (2013.01); *H01L 2933/0091* (2013.01)

(58) Field of Classification Search
CPC ......... G02F 1/133603; G02F 1/133606; H01L 33/60
USPC ...................................................... 362/84
See application file for complete search history.

(56) References Cited

U.S. PATENT DOCUMENTS

| 7,075,116 B2* | 7/2006 | Okazaki | H01L 33/504 257/100 |
| 8,378,369 B2* | 2/2013 | Hanawa | H01L 33/46 257/88 |
| 8,415,692 B2* | 4/2013 | Le Toquin | H01L 33/44 257/98 |
| 2005/0117320 A1* | 6/2005 | Leu | G02B 6/0023 362/612 |

(Continued)

FOREIGN PATENT DOCUMENTS

JP 2014205411 A 10/2014
KR 20100021035 A * 2/2010

(Continued)

*Primary Examiner* — Matthew J. Peerce
(74) *Attorney, Agent, or Firm* — Cantor Colburn LLP

(57) ABSTRACT

A display device includes a display panel and a backlight assembly. A light source unit of the backlight assembly includes a light source board including a conductive pattern, a light emitting chip on the light source board and electrically connected to the conductive pattern, a wavelength conversion member covering the light emitting chip and converting a wavelength of light emitted from the light emitting chip; and diffusion particles in the wavelength conversion member. The light emitting chip includes a rear surface facing the light source board, a top surface opposite to the rear surface and a side surface connecting the rear surface to the top surface. A density of the diffusion particles in the wavelength conversion member at the top surface of the light emitting chip is greater than a density of the diffusion particles in the wavelength conversion member at the side surface of the light emitting chip.

17 Claims, 6 Drawing Sheets

(56) References Cited

U.S. PATENT DOCUMENTS

| | | | | |
|---|---|---|---|---|
| 2008/0117500 A1* | 5/2008 | Narendran | ............ | H01L 33/507 359/326 |
| 2009/0272996 A1* | 11/2009 | Chakraborty | ......... | H01L 33/501 257/98 |
| 2010/0053939 A1* | 3/2010 | Fan | ...................... | G02B 6/0025 362/97.3 |
| 2011/0266574 A1* | 11/2011 | Liao | ...................... | H01L 33/508 257/98 |
| 2012/0146077 A1* | 6/2012 | Nakatsu | ................ | H01L 33/486 257/98 |

FOREIGN PATENT DOCUMENTS

| | | |
|---|---|---|
| KR | 1020100021035 A | 2/2010 |
| KR | 1020120001459 A | 1/2012 |

\* cited by examiner

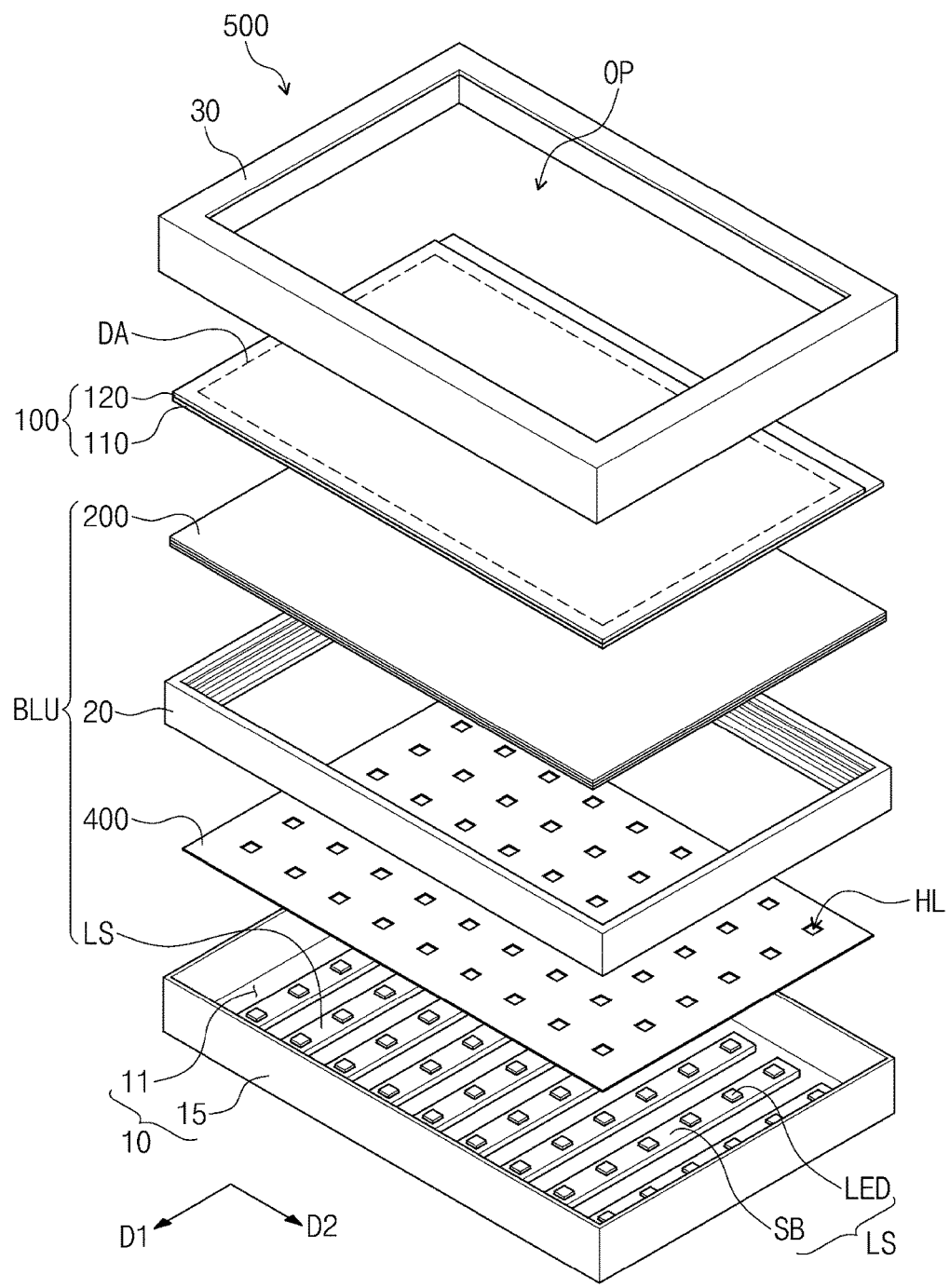

DISPLAY DEVICE

This application claims priority to Korean Patent Application No. 10-2016-0054186, filed on May 2, 2016, and all the benefits accruing therefrom under 35 U.S.C. § 119, the content of which in its entirety is herein incorporated by reference.

BACKGROUND

(1) Field

The present disclosure relates to a display device, and more particularly, to a display device including a backlight assembly to display an image by using light emitted from the backlight assembly.

(2) Description of the Related Art

A display device includes a display panel displaying an image with light and a backlight unit emitting the light to the display panel. The backlight assembly may include a light source unit generating light and various kinds of optical components uniformly controlling a light quantity per unit area of the light generated by the light source unit and provided toward the display panel by the backlight assembly. For example, the backlight assembly may include a diffusion plate disposed between the light source unit and the display panel or an optical lens covering a light emitting chip of the light source unit.

SUMMARY

One or more embodiment provides a display device including a backlight assembly of which the number of components is reduced.

An embodiment of the invention provides a display device including: a display panel which displays an image with light; and a backlight assembly which provides the light to the display panel. The backlight assembly includes a light source unit which generates light and emits the light toward the display panel.

The light source unit includes: a light source board including a conductive pattern; a light emitting chip which generates the light, is mounted on the light source board and is electrically connected to the conductive pattern; a wavelength conversion member which covers the light emitting chip and converts a wavelength of the light emitted from the light emitting chip; and diffusion particles which are dispersed in the wavelength conversion member and diffuse a light incident thereto.

The light emitting chip mounted on the light source board includes a rear surface which faces the light source board, a top surface opposite to the rear surface and a side surface which connects the rear surface to the top surface. For the wavelength conversion member covering the light emitting chip, a density of the diffusion particles dispersed in the wavelength conversion member at the top surface of the light emitting chip is greater than a density of the diffusion particles dispersed in the wavelength conversion member at the side surface of the light emitting chip.

In an embodiment of the invention, a display device includes: a display panel which displays an image with light; and a backlight assembly which provides the light to the display panel, the backlight assembly including a light source unit, which generates light and emits the light toward the display panel.

The light source unit includes: a light source board including a conductive pattern; a light emitting chip which generates the light, is mounted on the light source board and is electrically connected to the conductive pattern; a wavelength conversion member which covers the light emitting chip and converts a wavelength of the light emitted from the light emitting chip; a first cover layer which covers the wavelength conversion member and faces the light emitting chip with the wavelength conversion member therebetween, the first cover layer including diffusion particles dispersed therein and having a refractive index less than that of the wavelength conversion member.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 1 is an exploded perspective view illustrating an embodiment of a display device according to the invention;

DETAILED DESCRIPTION

Figure 2A:
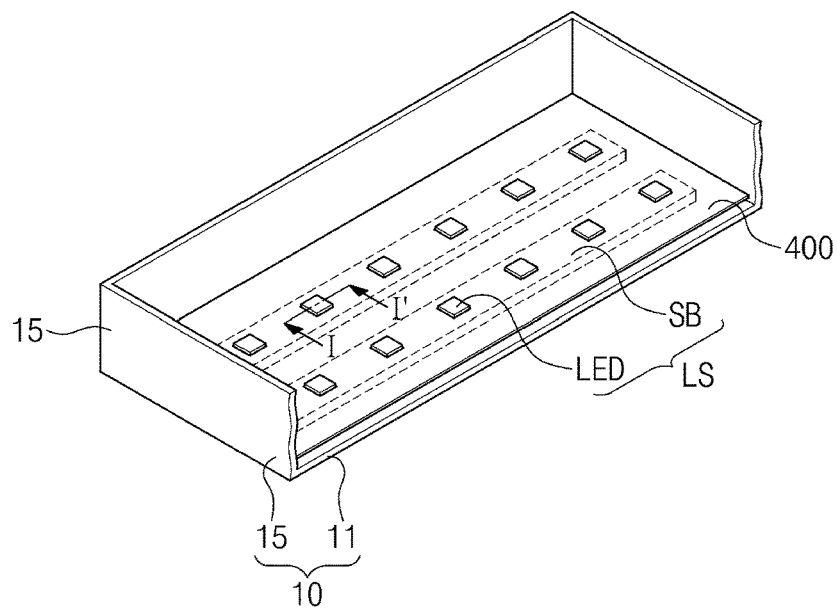
FIG. 2A is a partial perspective view illustrating an embodiment of a state in which an accommodation member, a plurality of light source units and a reflective member of the display device in FIG. 1 are coupled to each other.

Embodiments of the invention will be described below in more detail with reference to the accompanying drawings. The objects, features, and effects of the invention will be understood without difficulties through embodiments below related to the accompanying drawings. The invention may, however, be embodied in different forms and should not be construed as limited to the embodiments set forth herein. Rather, these embodiments are provided so that this disclosure will be thorough and complete, and will fully convey the scope of the invention to those skilled in the art. However, this may be merely illustrative, and thus the present disclosure is not limited thereto. Like reference numerals refer to like elements throughout.

It will be understood that although the terms "first" and "second" are used herein to describe various elements, these elements should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

In the specification, it will be understood that when a layer (or a film), a region, or a component is referred to as being 'on' another layer, region, or component, it can be directly on the other layer, region, or component, or intervening layers, regions, or components may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 is an exploded perspective view of an embodiment of a display device according to the invention.

Referring to FIG. 1, a display device 500 includes a display panel 100, a backlight assembly BLU, an accommodation member 10, a support member 20 and a cover member 30.

In the embodiment, the display panel 100 receives light from the backlight assembly BLU to generate and display an image through a display area DA of the display panel 100. In the embodiment, the display panel 100 may be a liquid crystal display panel and include a first display substrate 110, a second display substrate 120, and a liquid crystal layer (not shown) disposed between the first and second display substrates 110 and 120.

In the embodiment, the first display substrate 110 includes a plurality of pixels in the display area DA and at which the image is generated. A non-display area of the first display substrate 110 may be a remaining portion of the first display substrate 110 except for the display area DA thereof. The display area DA and the non-display area of the first display substrate 110 may respectively correspond to the same of the display panel 100 and/or the display device 500.

Each of the plurality of pixels may include a pixel electrode (not shown) and a thin film transistor (not shown) which switches a driving signal provided to the pixel electrode. The pixel electrode and the thin film transistor may be provided in plurality in the display area DA. Also, the second display substrate 120 may include a common electrode (not shown) and a color filter (not shown) in the display area. The common electrode provides an electric field acting on the liquid crystal layer (not shown) together with the pixel electrode, and the color filter filters light emitted from the backlight assembly BLU into color light. The color filter may be provided in plurality in the display area DA. The common electrode may be provided in plurality in the display area DA or may be disposed common to all the pixels in the display area DA.

Although the display panel 100 may have the above-described structure in the embodiment, the invention is not limited to the structure of the above-described display panel 100. In another embodiment, for example, according to the invention, the second display substrate 120 may not include the common electrode and the color filter, and the first display substrate 110 may include the color filter and the common electrode in addition to the other elements of the first display substrate 110 described above.

The backlight assembly BLU generates light and emits the light toward the display panel 100. In the embodiment, the backlight assembly BLU may include a light source unit LS provided in plurality, a reflective member 400 and an optical sheet 200.

The plurality of light source units LS generate the light emitted by the backlight assembly BLU to the display panel 100. The plurality of light source units LS are arranged on a bottom portion 11 of the accommodation member 10. In the embodiment, when the bottom portion 11 has a relatively short side of which a length thereof extends in a first direction D1 and a relatively long side of which a length thereof extends in a second direction D2 perpendicular to the first direction D1, the plurality of light source units LS may be spaced a predetermined distance from each other on the bottom portion 11 in the second direction D2.

In the embodiment, each of the plurality of light source units LS may include a light source board SB and a light emitting chip LED provided in plurality mounted on a same light source board SB. The light source board SB with light emitting chips LED mounted thereon, may be provided in plurality. The light source board SB may have an overall shape of a bar for which a length thereof extends in the first direction D1. In the embodiment, each of the plurality of light emitting chips LED may include a light emitting diode, and the plurality of light emitting chips LED may be spaced a predetermined distance along the length of the light source board SB in the first direction D1.

The reflective member 400 is disposed above the bottom portion 11 of the accommodation member 10, in a third direction (e.g., thickness direction) taken from the accommodation member 10 toward the cover member 30. A hole HL provided in plurality is defined in and by the reflective member 400. Also, the plurality of holes HL may be disposed at positions one-to-one corresponding to positions of the plurality of light emitting chips LED Accordingly, the plurality of light emitting chips LED may be accommodated in the reflective member 400 one-to-one corresponding to the plurality of holes HL.

According to an embodiment of the invention, the reflective member 400 may be further disposed on a side wall 15 of the accommodation member 10. The side wall 15 is provided in plurality each extended from the bottom portion 11 of the accommodation member 10.

The optical sheet 200 is disposed between the display panel 100 and the reflective member 400. The optical sheet 200 changes a traveling direction of light generated by the plurality of light source units LS. In an embodiment, for example, the optical sheet 200 may collectively include a diffusion sheet for diffusing the light generated in the plurality of light source units LS and a prism sheet for collecting the light in a front direction of the display panel 100 (e.g., towards the cover member 30 at a viewing side of the display device 500).

The accommodation member 10 may include the bottom portion 11 and the sidewalls 15 which extend from the bottom portion 11, and an accommodation space may be defined in the accommodation member 10 thereby. The backlight assembly BLU and the display panel 100 are accommodated in the accommodation space of the accommodation member 10, and the support member 20 and the cover member 30 are coupled to the accommodation member 10.

The support member 20 has an overall shape extending along edges of the display panel 100 to support the edges of the display panel 100. Also, a plurality of stepped portions may be defined at an inside of the support member 20 (e.g., towards the display area DA). The edges of the display panel 100 and edges of the optical sheets 200 may be coupled to the plurality of stepped portions of the support member 20.

The cover member 30 covers the edges of the display panel 100. Also, an opening OP corresponding to the display area DA may be defined in and by the cover member 30. Accordingly, the display area DA of the display panel 100 may be exposed through the opening OP at the viewing side of the display device 500.

Figure 2B:
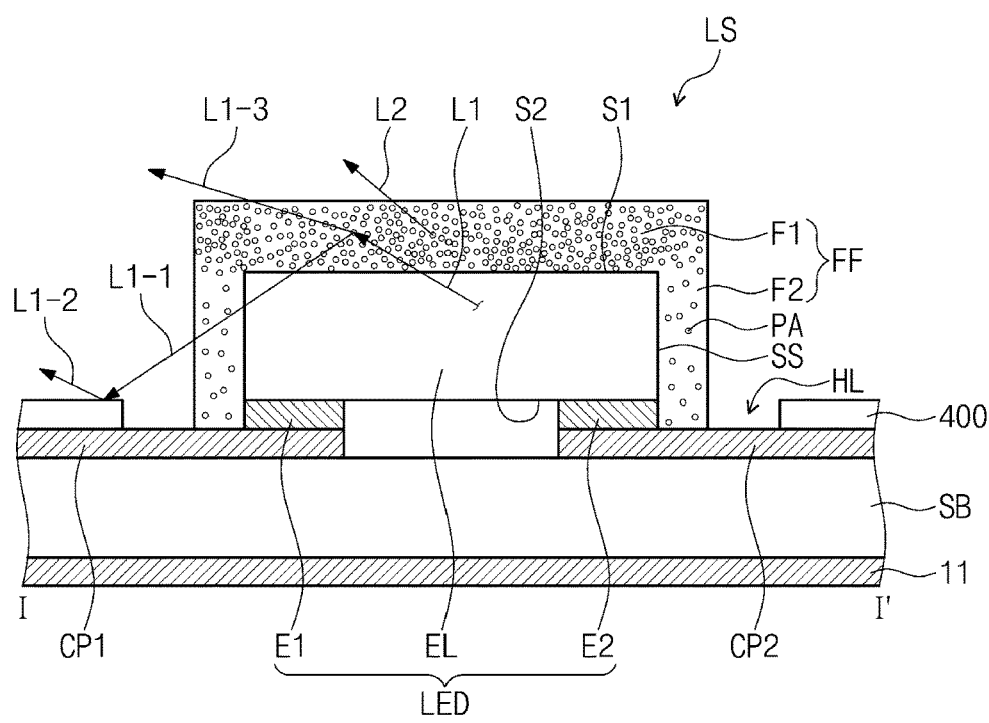
FIG. 2B is a cross-sectional view taken along line I-I' of FIG. 2A.

FIG. 2A is a partial perspective view illustrating an embodiment of a state in which the accommodation member 10, the plurality of light source units LS and the reflective member 400 of the display device 500 in FIG. 1 are coupled to each other, and FIG. 2B is a cross-sectional view taken along line I-I' in FIG. 2A.

In describing FIGS. 2A and 2B, since each among the plurality of light source units LS may have structures similar to each other, a structure of one light source unit LS among the plurality of light source units LS will be described as an example, and the rest of the light source units LS will not be individually described. Also, each the light source unit LS may include the plurality of light emitting chips LED mounted thereon, and each among the plurality of emitting chips LED may have structures similar to each other. Accordingly, the structure of one light emitting chip LED among the plurality of light emitting chips LED will be described as an example, and the rest of the light emitting chips LED will not be individually described.

Referring to FIGS. 2A and 2B, the light source unit LS includes the light source board SB, the light emitting chip LED, a wavelength conversion member FF and a diffusion particle PA provided in plurality.

The light source board SB includes a plurality of conductive patterns or lines. As illustrated in FIG. 2B, for example, the light source board SB includes a first conductive pattern CP1 and a second conductive pattern CP2. The first and second conductive patterns CP1 and CP2 may be physically and/or electrically connected to the light emitting chip LED, and power may be applied to the light emitting chip LED through the first and second conductive patterns CP1 and CP2.

The light emitting chip LED is mounted on the light source board SB. In the embodiment, the light emitting chip LED includes a first electrode E1, a second electrode E2 and a light emitting layer EL. The first electrode E1 is electrically connected to the first conductive pattern CP1, and the second electrode E2 is electrically connected to the second conductive pattern CP2. Also, the light emitting layer EL may include a semiconductor material such as a compound semiconductor, and, in the embodiment, the light emitting layer EL may emit blue light, but not limited thereto.

In the embodiment, the light emitting chip LED may have a structure of a flip chip. Accordingly, the first electrode E1 may be electrically connected to the first conductive pattern CP1, and the second electrode E2 may be electrically connected to the second conductive pattern CP2.

In the embodiment, when a top surface S1, a rear surface S2 facing the top surface S1, and a side surface SS connecting the top surface S1 to the rear surface S2 are defined by the light emitting chip LED, the rear surface S2 is mounted to the light source board SB, and the light emitting chip LED emits light through the top surface S1 and the side surface SS. The side surface SS may be provided in plurality each connecting the top surface S1 and the rear surface S2 to each other.

The wavelength conversion member FF covers the light emitting chip LED, and the wavelength conversion member FF converts a wavelength of light emitted from the light emitting chip LED to a different wavelength. As covering the light emitting chip LED, the wavelength conversion member FF may be disposed at the top surface S1 of the light emitting chip LED and extend therefrom along one or more of the side surfaces SS toward the light source board SB. For the embodiment, when the light emitting chip LED emits the blue light, the wavelength conversion member FF may include a fluorescent material to convert the blue light into white light. In the embodiment, the wavelength conversion member FF may include at least one of an yttrium aluminum garnet (YAG)-based fluorescent material, a silicate-based fluorescent material, a nitride-based fluorescent material and an oxynitride-based fluorescent material.

According to another embodiment, the wavelength conversion member FF may include quantum dots instead of the fluorescent material.

For the embodiment, when the light emitting chip LED has the flip chip structure, the wavelength conversion member FF may surround the light emitting chip LED on the light source board SB. The light emitting chip LED and the wavelength conversion member FF may be collectively referred to as a light emitting member. As surrounding the light emitting chip LED, the wavelength conversion member FF may be disposed at the top surface S1 of the light emitting chip LED and extend therefrom along each of the side surfaces SS toward the light source board SB. In more detail, the wavelength conversion member FF may include or define a first wavelength conversion portion F1 and a second wavelength conversion portion F2. The first wavelength conversion portion F1 covers the top surface S1 of the light emitting chip LED, and the second wavelength conversion portion F2 is connected to the first wavelength conversion portion F1 to cover the side surface SS of the light emitting chip LED. Accordingly, the light emitted through the top surface S1 and the side surface SS of the light emitting chip LED may have a wavelength converted by the first and second wavelength conversion parts F1 and F2, respectively.

The diffusion particles PA may be dispersed in the wavelength conversion member FF. In the embodiment, a composition material of the diffusion particles PA may include a transflective material such as titanium dioxide ($TiO_2$). Accordingly, when first light L1 emitted from the light emitting chip LED and having a first wavelength and second light L2 having a second wavelength which is converted from that of the first light L1 by the wavelength conversion member FF are defined, a first portion of the first and second lights L1 and L2 may be reflected by the diffusion particles PA, another portion of the first and second light L1 and L2 different from the first portion thereof may be refracted by the diffusion particles PA, and still another portion of the first and second light L1 and L2 different from the first portion thereof may be absorbed by the diffusion particles PA. A minimal portion of the first light L1 and/or the second light L2 may not be converted, reflected or refracted as described above, and may merely pass through the wavelength conversion member FF to finally exit the wavelength conversion member FF unchanged.

For the embodiment, when the composition material of the diffusion particles PA is the titanium dioxide, about 90% of a light quantity of the first and second light L1 and L2 incident to the diffusion particles PA may be reflected by the diffusion particles PA, and about 10% of the light quantity may be refracted or absorbed.

A path of the first light L1 among the first and second lights L1 and L2, which is changed by the diffusion particles PA, will be described as follows. When the first light L1 is emitted from the light emitting chip LED, the first light L1 is incident to the wavelength conversion member FF and reflected by the diffusion particles PA therein to be defined as first reflected light L1-1, and the first reflected light L1-1 is reflected by the reflective member 400 and defined as second reflected light L1-2. Also, the first light L1 may be refracted by the diffusion particles PA and defined as refracted light L1-3.

As described above, since the first light L1 is changed to the first and second reflected light L1-1 and L1-2 and/or the refracted light L1-3 by the diffusion particles PA, diffusivity of the light emitted from the light emitting chip LED may be improved, and, accordingly, a radiation angle of the emitted light may increase.

Although not shown, similar to that described above for the first light L1, the second light L2 converted within the wavelength conversion member FF may be reflected by the diffusion particles PA within the wavelength conversion member FF to finally exit therethrough and may be further reflected by the reflective member 400 outside the wavelength conversion member FF. Also, the second light L2 converted within the wavelength conversion member FF may be refracted by the diffusion particles PA to finally exit through the wavelength conversion member FF.

In a conventional light source unit, when the diffusion particles PA are omitted, the light emitting chip may be covered by an additional element such as an optical lens such as a top-emission lens or a side-emission lens to increase the radiation angle of light emitted therefrom. However, in one or more embodiment of a light source unit LS according to the invention, since the diffusion particles PA may be dispersed in the wavelength conversion member FF which covers the light emitting chip LED to increase the radiation angle of the light emitted therefrom, the conventional optical lens may be omitted from the light source unit LS.

In the embodiment, the diffusion particles PA dispersed in the wavelength conversion member FF may have densities different from each other according to positions thereof within the wavelength conversion member FF. In more detail, in the embodiment, a light quantity emitted through a unit area of the side surface SS of the light emitting chip LED may be greater than that emitted through a unit area of the top surface S1 thereof. In this case, the diffusion particles PA dispersed in the first wavelength conversion portion F1 covering the top surface S1 of the light emitting chip LED may have a density greater than that of the diffusion particles PA dispersed in the second wavelength conversion portion F2 covering the side surface SS thereof. That is, an amount of the diffusion particles PA provided per unit volume of the first wavelength conversion portion F1 may be greater than that of the diffusion particles PA provided per a same size unit volume of the second wavelength conversion portion F2.

In an embodiment, for example, the light quantity emitted through the unit area of the side surface SS may be about 40% of the light quantity emitted through the unit area of the top surface S1. In this case, the density of the diffusion particles PA dispersed in the second wavelength conversion portion F2 may be about 40% of that of the diffusion particles PA dispersed in the first wavelength conversion portion F1. As described above, when the diffusion particles PA are provided at different densities within the first and second wavelength conversion parts F1 and F2, a degree of the refraction or reflection of the light may be easily controlled by the diffusion particles PA in correspondence with the light quantity of the light provided to the first and second wavelength conversion parts F1 and F2 from the light emitting chip LED.

Figure 3:
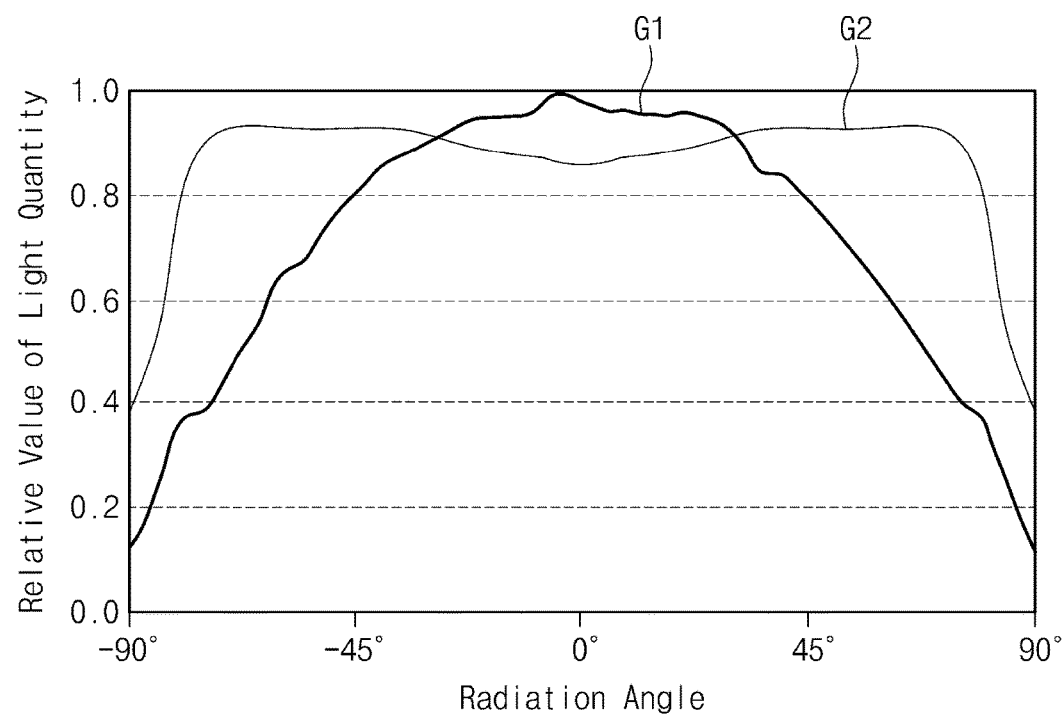
FIG. 3 illustrates graphs representing a relative value of a light quantity according to a radiation angle of light emitted from the light emitting chip, according to a comparative example and an embodiment of the invention.

FIG. 3 illustrates graphs representing a relative value of a light quantity according to a radiation angle of light emitted from the light emitting chip, according to a comparative example and an embodiment of the invention.

Referring to FIG. 3, a first graph G1 according to the comparative example represents a relative value of a light quantity according to a radiation angle of a light emitting chip covered by a wavelength conversion member in which diffusion particles are not provided. A second graph G2 according to an embodiment of the invention represents a relative value of a light quantity according to a radiation angle of the light emitting chip (LED in FIG. 2B) covered by the wavelength conversion member (FF in FIG. 2B) in which the diffusion particles (PA in FIG. 2B) are provided.

Referring to the first graph G1, the light quantity emitted from the light emitting chip of the comparative example has a maximum value when the radiation angle is about 0°, and the light quantity is reduced to about 50% of the maximum value when the radiation angle is about −60° or about +90°. Also, as the radiation angle ranges from about 0° to about −90° or to about +90°, the light quantity is reduced to about 20% of the maximum value.

However, referring to the second graph G2, the light quantity emitted from the light emitting chip of the embodiment of the invention has the maximum value when the radiation angle is about 65°, and the light quantity may be maintained at a level of about 80% with respect to the maximum value when the radiation angle ranges from about 0° to about −75° or from about 0° to about +75°.

Accordingly, for the embodiment of the invention in FIG. 2B, when the diffusion particles (PA in FIG. 2B) are dispersed in the wavelength conversion member (FF in FIG. 2B), since the light emitted from the wavelength conversion member or the light emitting layer (EL in FIG. 2B) is refracted or reflected by the diffusion particles, a degree of reduction of the light quantity may be reduced although the radiation angle increases. In other words, when a radiation angle at which the light quantity is maintained to a predetermined level with respect to the maximum value is defined as an acceptable radiation angle, the acceptable radiation angle may increase in one or more embodiment of the invention.

Figure 4:
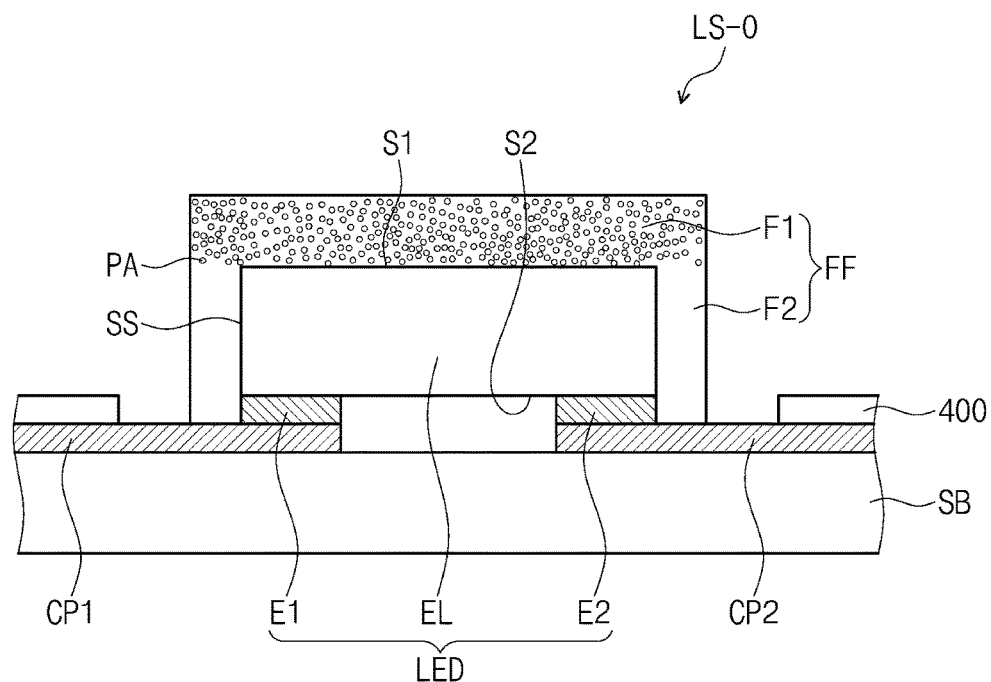
FIG. 4 is a cross-sectional view of another embodiment of a light source unit applied to a backlight assembly of a display device according to the invention.

FIG. 4 is a cross-sectional view of another embodiment of a light source unit applied to a backlight assembly of a display device according to the invention. In describing FIG. 4, reference numerals for above-described elements are given, and overlapped description for the elements will be omitted.

Referring to FIG. 4, a light source unit LS-0 includes a light source board SB, a light emitting chip LED mounted on the light source board SB, a wavelength conversion member FF covering the light emitting chip LED, and diffusion particles PA dispersed in the wavelength conversion member FF.

In the embodiment illustrated in FIG. 2B, the diffusion particles (PA in FIG. 2B) are dispersed in each of the first and second wavelength conversion portions (F1 and F2 in FIG. 2B) of the wavelength conversion member (FF in FIG. 2B), and the diffusion particles dispersed in the first wavelength conversion portion have a density greater than that of the diffusion particles dispersed in the second wavelength conversion portion (F2 in FIG. 2B). In contrast, in the embodiment illustrated in FIG. 4, the diffusion particles PA are dispersed in the first wavelength conversion portion F1 and are not dispersed in the second wavelength conversion portion F2 to be disposed only in the first wavelength conversion portion F2.

In a top plan view of the display device, the top surface S1 of the light emitting chip LED defines a planar area thereof, such as in the first and second directions (D1 and D2 in FIG. 1). In a cross-sectional view of a plane defined by the first (D1 in FIG. 1) and third (thickness) directions or by the second (D2 in FIG. 1) and third directions, the side surface SS of the light emitting chip defines a planar area thereof.

In the embodiment, the planar area of the side surface SS of the light emitting chip LED may be less than that of the top surface S1 thereof, and a second light quantity emitted from the side surface SS and to the second wavelength conversion portion F2 may be less than a first light quantity emitted from the top surface S1 and to the first wavelength conversion portion F1. Accordingly, when a degree in which the second light quantity is refracted or reflected by the diffusion particles PA is less than that in which the first light quantity is refracted or reflected by the diffusion particles PA, the diffusion particles PA in the second wavelength conversion portion F2 may be omitted.

Figure 5:
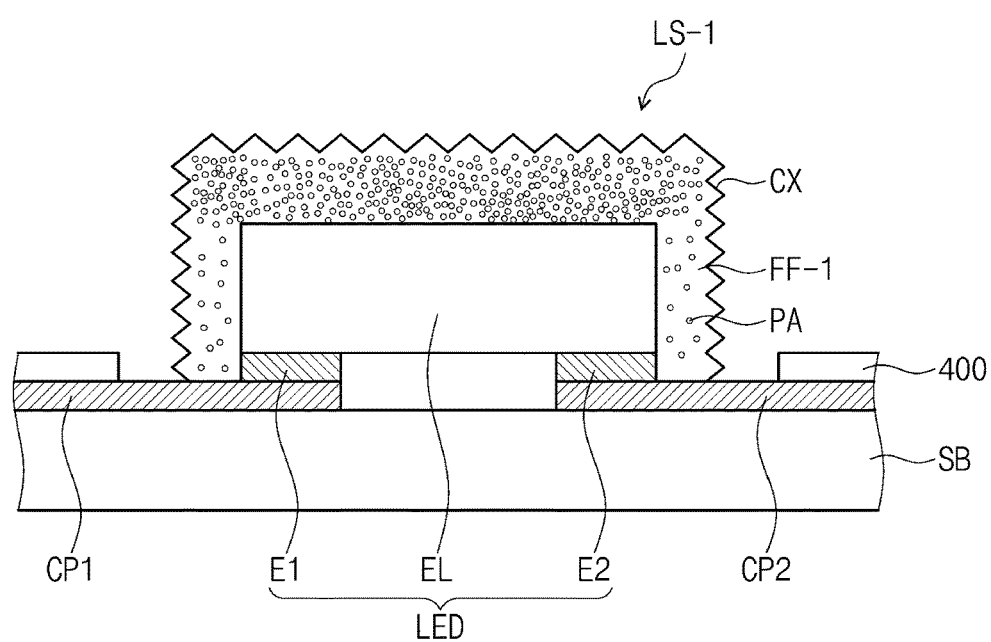
FIG. 5 is a cross-sectional view of still another embodiment of a light source unit applied to a backlight assembly of a display device according to the invention.

FIG. 5 is a cross-sectional view of still another embodiment of a light source unit LS-1 applied to a backlight assembly of a display device according to the invention. In describing FIG. 5, reference numerals for above-described elements are given, and overlapped description for the elements will be omitted.

Referring to FIG. 5, the light source unit LS-1 includes a light source board SB, a light emitting chip LED mounted on the light source board SB, a wavelength conversion member FF-1 covering the light emitting chip LED, and diffusion particles PA dispersed in the wavelength conversion member FF-1.

In the embodiment, an uneven pattern CX is defined in or at an outer surface of the wavelength conversion member FF-1. The uneven pattern CX may be defined as a plurality of protrusions each protruding from a common surface of the wavelength conversion member FF-1. Accordingly, light emitted from the light emitting chip LED and through wavelength conversion member FF-1 may be dispersed by the uneven pattern CX as well as the diffusion particles PA.

Figure 6:
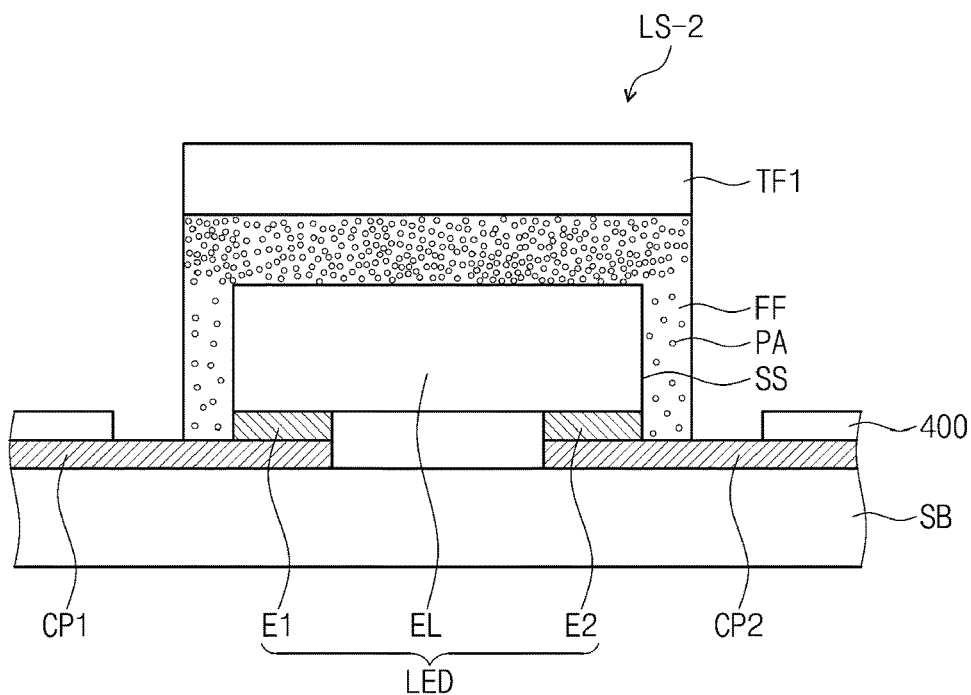
FIG. 6 is a cross-sectional view of yet another embodiment of a light source unit applied to a backlight assembly of a display device according to the invention.

FIG. 6 is a cross-sectional view of yet another embodiment of a light source unit LS-2 applied to a backlight assembly of a display device according to the invention. In describing FIG. 6, reference numerals for above-described elements are given, and overlapped description for the elements will be omitted.

Referring to FIG. 6, the light source unit LS-2 includes a light source board SB, a light emitting chip LED mounted on the light source board SB, a wavelength conversion member FF covering the light emitting chip LED, diffusion particles PA dispersed in the wavelength conversion member FF, and a cover layer TF1 disposed on the wavelength conversion member FF. That is, when the embodiment illustrated in FIG. 2B and the embodiment illustrated in FIG. 6 are compared with each other, the light source unit LS-2 further includes the cover layer TF1.

In the embodiment, a composition material of the cover layer TF1 may include a polymer material, and the cover layer TF1 may have a refractive index less than that of the underlying wavelength conversion member FF. In the embodiment, the refractive index of the wavelength conversion member FF may range from about 2.0 to about 3.0 due to fluorescent materials dispersed in the wavelength conversion member FF, and the refractive index of the cover layer TF1 may be less than about 2.0. In an embodiment, for example, the composition material of the cover layer TF1 may include polyether sulfone ("PES"), polyethylene terephthalate ("PET") or poly methyl methacrylate ("PMMA"), each of which has the refractive index of from about 1.4 to about 1.8.

According to the composition of the above-described cover layer TF1, when light emitted from the light emitting chip LED and the wavelength conversion member FF reaches the cover layer TF1, since the refractive index is changed at an interface between the wavelength conversion member FF and the cover layer TF1, the light may be refracted at the interface. Also, as described above, since the refractive index of the wavelength conversion member FF is greater than that of the cover layer TF1, refracted light defined by the refraction of the light emitted from the light emitting chip LED and the wavelength conversion member FF to the cover layer TF1 travels in a direction that is more inclined than that of the light with respect to a normal direction of the light emitting chip LED. Accordingly, diffusivity of the light emitted from the light emitting chip LED may be improved, and a radiation angle of the emitted light may increase.

Figure 7:
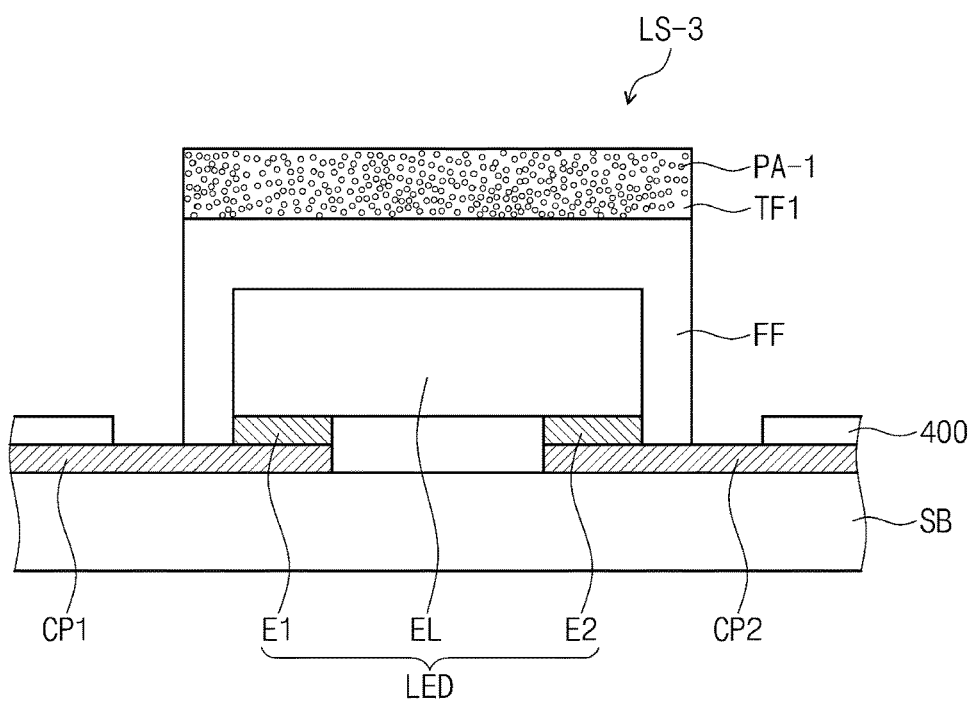
FIG. 7 is a cross-sectional view of yet another embodiment of a light source unit applied to a backlight assembly of a display device according to the invention.

FIG. 7 is a cross-sectional view of yet another embodiment of a light source unit LS-3 applied to a backlight assembly of a display device according to the invention. In describing FIG. 7, reference numerals for above-described elements are given, and overlapped description for the elements will be omitted.

Referring to FIG. 7, the light source unit LS-3 includes a light source board SB, a light emitting chip LED mounted on the light source board SB, a wavelength conversion member FF covering the light emitting chip LED, a cover layer TF1 disposed on the wavelength conversion member FF and diffusion particles PA-1 dispersed in the cover layer TF1.

Where the diffusion particles (PA in FIG. 2B) are dispersed in the wavelength conversion member (FF in FIG. 2B) in the embodiment previously described with reference to FIG. 2B, the diffusion particles PA-1 are dispersed in the cover layer TF1 instead of the wavelength conversion member FF in the embodiment illustrated in FIG. 7 to be disposed only in the cover layer TF1.

In the embodiment, a composition material of the diffusion particles PA-1 may include a transflective material such as titanium dioxide ($TiO_2$), and, in another embodiment, the diffusion particles PA-1 may include a reflective material such as silver (Ag) and aluminum (Al).

Like the previous embodiment, light emitted from the light emitting chip LED and the wavelength conversion member FF to the cover layer TF1 may be refracted or reflected by the diffusion particles PA-1 dispersed in the cover layer TF1 before finally exiting therefrom.

Also, a composition material of the cover layer TF1 may include a polymer material, and the cover layer TF1 may have a refractive index less than that of the wavelength conversion member FF. Accordingly, since the refractive index is changed at an interface between the wavelength conversion member FF and the cover layer TF1, refracted light defined by the refraction of the light emitted from the light emitting chip LED or the wavelength conversion member FF travels in a direction that is more inclined than that of the light with respect to a normal direction of the light emitting chip LED. As a result, diffusivity of the light emitted from the light emitting chip LED may be improved, and a radiation angle of the emitted light may increase.

Figure 8:
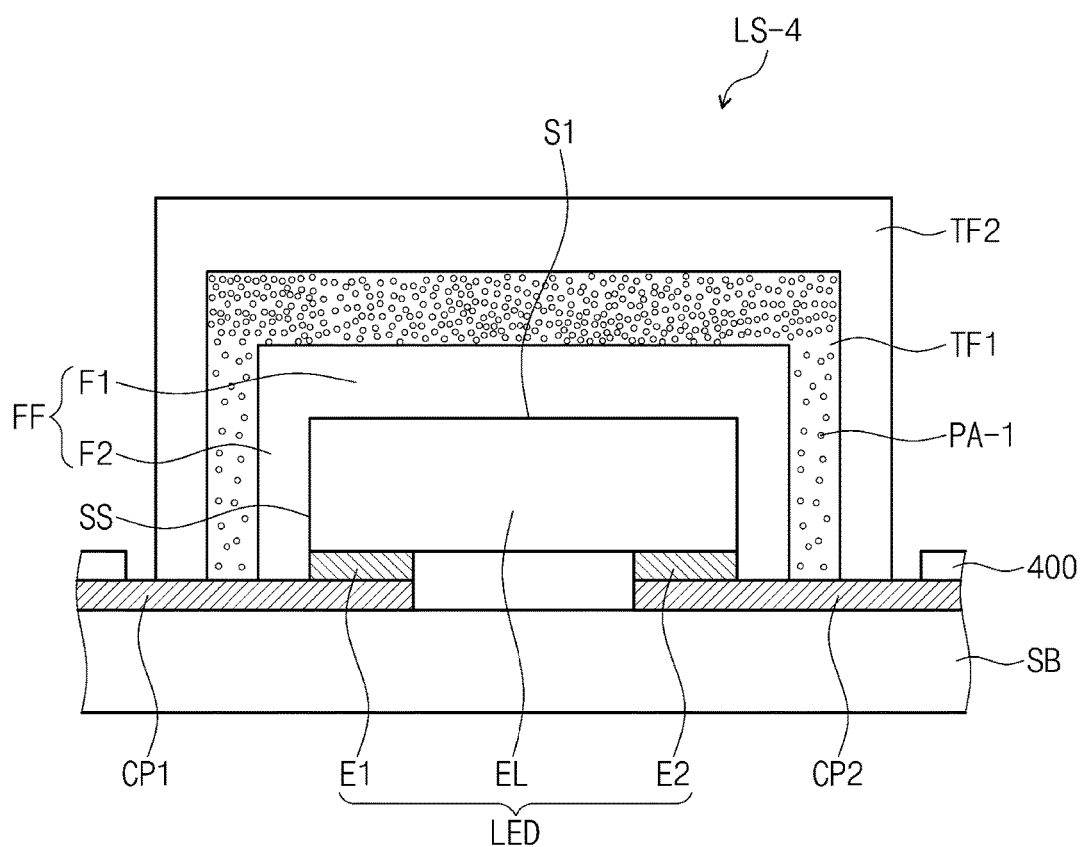
FIG. 8 is a cross-sectional view of yet another embodiment of a light source unit applied to a backlight assembly of a display device according to the invention.

FIG. 8 is a cross-sectional view of yet another embodiment of a light source unit LS-4 applied to a backlight assembly of a display device according to the invention. In describing FIG. 8, reference numerals for above-described elements are given, and overlapped description for the elements will be omitted.

Referring to FIG. 8, the light source unit LS-4 includes a light source board SB, a light emitting chip LED mounted on the light source board SB, a wavelength conversion member FF covering the light emitting chip LED, a first cover layer TF1 disposed on the wavelength conversion member FF, diffusion particles PA-1 dispersed in the cover layer TF1, and a second cover layer TF2 disposed on the first cover layer TF1.

In the embodiment, the diffusion particles PA-1 are not dispersed in the wavelength conversion member FF but are dispersed in the first cover layer TF1. Also, the first cover layer TF1 may cover a first wavelength conversion portion F1 and a second wavelength conversion portion F2 of the wavelength conversion member FF, and the diffusion particles PA dispersed in the first cover layer TF1 may have densities different according to positions in the wavelength conversion member FF.

In more detail, a density of the diffusion particles PA-1 dispersed in one portion of the first cover layer TF1, which covers the first wavelength conversion portion F1, is greater than that of the diffusion particles PA-1 dispersed in another portion of the first cover layer TF1, which covers the second wavelength conversion portion F2. Accordingly, as described above, when the diffusion particles PA-1 in different densities are provided in the first cover layer TF1, a degree of refraction or reflection of the light may be easily controlled by the diffusion particles PA-1 in correspondence with a light quantity of the light provided to the first cover layer TF1 from the wavelength conversion member FF.

The second cover layer TF2 is disposed on the first cover layer TF1 to cover the first and second wavelength conversion portions F1 and F2. Also, the second cover layer TF2 may have a refractive index less than that of the first cover layer TF1.

In the embodiment, a composition material of each of the first and second cover layers TF1 and TF2 may include a polymer material, and, in this case, the first cover layer TF1 may include polyether sulfone ("PES") having a refractive index of about 1.65, and the second cover layer TF2 may include poly methyl methacrylate ("PMMA") having a refractive index of about 1.49.

Accordingly, since the refractive index is changed at a first interface between the wavelength conversion member FF and the first cover layer TF1, the light emitted from the light emitting chip LED or the wavelength conversion member FF is first-refracted at the first interface. Also, since the refractive index is changed at a second interface between the first cover layer TF1 and the second cover layer TF2, the first-refracted light may be second-refracted at the second interface. Also, as the light is first and second refracted, the light travels in a direction that is more inclined than that of the light with respect to a normal direction of the light emitting chip LED. As a result, diffusivity of the light emitted from the light emitting chip LED may be improved, and a radiation angle of the emitted light may increase.

According to one or more embodiment of the invention, the density of the diffusion particles dispersed in the wavelength conversion member covering the light emitting chip or the diffusion particles dispersed in the cover layer may be controlled to increase the radiation angle of the light emitted from the light emitting chip. Accordingly, an optical lens of a conventional light source unit for covering the light emitting chip thereof and dispersing the light emitted from the light emitting chip may be omitted from the backlight assembly of the display device including the diffusion particles.

According to another embodiment of the invention, the refractive index of the cover layer covering the light emitting chip may be adjusted to increase the radiation angle of the light emitted from the light emitting chip. Accordingly, an optical lens of a conventional light source unit for dispersing the light emitted from the light emitting chip may be omitted from the backlight assembly of the display device including the cover layer.

Although the exemplary embodiments of the invention have been described, it is understood that the invention should not be limited to these exemplary embodiments but various changes and modifications can be made by one ordinary skilled in the art within the spirit and scope of the invention as hereinafter claimed. Hence, the scope of the invention shall be determined by the technical scope of the accompanying claims.

What is claimed is:

1. A display device comprising:
a display panel which displays an image with light; and
a backlight assembly which provides the light to the display panel, the backlight assembly comprising a light source unit which generates the light and emits the light toward the display panel, wherein the light source unit comprises:
a light source board comprising a conductive pattern;
a light emitting chip which generates the light, the light emitting chip mounted on the light source board and electrically connected to the conductive pattern;
a wavelength conversion member which covers the light emitting chip and comprises a wavelength-converting material which converts a wavelength of the light emitted from the light emitting chip; and
diffusion particles which are dispersed in the wavelength conversion member and diffuse a light incident thereto, the diffusion particles being different from the wavelength-converting material,
wherein
the light emitting chip includes a rear surface which faces the light source board, a top surface opposite to the rear surface, and a side surface which connects the rear surface to the top surface,
a density of the diffusion particles dispersed in the wavelength conversion member at the top surface of the light emitting chip is greater than a density of the diffusion particles dispersed in the wavelength conversion member at the side surface of the light emitting chip,
each of the light emitting chip and the wavelength conversion member is provided in plural on a single light source board,
the wavelength conversion members are disposed apart from each other on the single light source board and respectively contact the single light source board, and
the wavelength conversion members respectively cover the light emitting chips.

2. The display device of claim 1, wherein the wavelength conversion member comprises:
a first wavelength conversion portion which covers the top surface of the light emitting chip; and
a second wavelength conversion portion which covers the side surface of the light emitting chip,
wherein an amount of diffusion particles provided in a unit volume of the first wavelength conversion portion is greater than that of diffusion particles provided to a same size unit volume of the second wavelength conversion portion.

3. The display device of claim 2, wherein the diffusion particles are not disposed in the second wavelength conversion portion.

4. The display device of claim 1, wherein a material of the diffusion particles both reflects and refracts the light incident thereto.

5. The display device of claim 1, wherein a material of the diffusion particles comprises a reflective material.

6. The display device of claim 1, wherein the light emitting chip comprises:
the conductive pattern provided in plurality,
a first electrode contacting one of the conductive patterns;
a second electrode contacting another of the conductive patterns; and
a light emitting layer which is electrically connected to the first and second electrodes.

7. The display device of claim 6, wherein a first portion of the wavelength conversion member is disposed on the top surface of the light emitting chip, the first portion extending from the top surface and along the side surface to the light source board, to surround the light emitting chip mounted on the light source board.

8. The display device of claim 1, wherein the light source unit further comprises a cover layer which covers the wavelength conversion member to face the light emitting chip with the wavelength conversion member therebetween, and
the cover layer has a refractive index less than that of the wavelength conversion member disposed between the cover layer and the light emitting chip.

9. The display device of claim 1, wherein the wavelength conversion member comprises an uneven pattern defined by protrusions at an outer surface of the wavelength conversion member.

10. A display device comprising:
a display panel which displays an image with light; and
a backlight assembly which provides the light to the display panel, the backlight assembly comprising a light source unit which generates the light and emits the light toward the display panel, wherein the light source unit comprises:
a light source board comprising a conductive pattern;
a light emitting chip which generates the light, the light emitting chip mounted on the light source board and electrically connected to the conductive pattern;
a wavelength conversion member which covers the light emitting chip and converts a wavelength of the light emitted from the light emitting chip, the wavelength conversion member comprising:
a first wavelength conversion portion covering a top surface of the light emitting chip; and
a second wavelength conversion portion covering a side surface of the light emitting chip; and
a first cover layer which covers the wavelength conversion member and faces the light emitting chip with the wavelength conversion member therebetween, the first cover layer having a refractive index less than that of the wavelength conversion member, wherein the first cover layer comprises:
a first cover portion which covers the first wavelength conversion portion of the wavelength conversion member, and
a second cover portion which covers the second wavelength conversion portion of the wavelength conversion member,
the diffusion particles are dispersed in the first cover portion and the second cover portion, and a density of the diffusion particles dispersed in the first cover portion is greater than a density of the diffusion particles dispersed in the second cover portion, wherein each of the light emitting chip, the wavelength conversion member, and the first cover layer is provided in a plural on a single light source board, the wavelength conversion members are disposed apart from each other on the single light source board, and the wavelength conversion members respectively cover the light emitting chips and respectively contact the single light source board.

11. The display device of claim 10, wherein a material of the diffusion particles both reflects and refracts light incident thereto.

12. The display device of claim 10, wherein a material of the diffusion particles comprises a reflective material.

13. The display device of claim 10, wherein the light emitting chip comprises:

the conductive pattern provided in plural;

a first electrode contacting one of the conductive patterns;

a second electrode contacting another of the conductive patterns; and a light emitting layer which is electrically connected to the first and second electrodes.

14. The display device of claim 13, wherein a first portion of the wavelength conversion member is disposed on a top surface of the light emitting chip, the first portion extending from the top surface and along a side surface of the light emitting chip to the light source board, to surround the light emitting chip mounted on the light source board.

15. The display device of claim 10, wherein the light source unit further comprises a second cover layer which covers the first cover layer and faces the light emitting chip with the first cover layer therebetween, and the second cover layer has a refractive index less than that of the first cover layer.

16. The display device of claim 10, wherein the wavelength conversion member and the first cover layer define an interface therebetween at which light is refracted.

17. The display device of claim 16, wherein the wavelength conversion member comprises a wavelength-converting material, and the diffusion particles in the first cover layer comprise a material different from the wavelength-converting material.

* * * * *